(12) United States Patent
Wang

(10) Patent No.: US 8,143,630 B2
(45) Date of Patent: Mar. 27, 2012

(54) ZINC SULFIDE SUBSTRATES FOR GROUP III-NITRIDE EPITAXY AND GROUP III-NITRIDE DEVICES

(75) Inventor: Shaoping Wang, Brookfield, CT (US)

(73) Assignee: Fairfield Crystal Technology, LLC, New Milford, CT (US)

( * ) Notice: Subject to any disclaimer, the term of this patent is extended or adjusted under 35 U.S.C. 154(b) by 137 days.

(21) Appl. No.: 12/574,092

(22) Filed: Oct. 6, 2009

(65) Prior Publication Data

US 2010/0084664 A1    Apr. 8, 2010

Related U.S. Application Data

(60) Provisional application No. 61/195,446, filed on Oct. 7, 2008.

(51) Int. Cl.
*H01L 27/15* (2006.01)
*H01L 31/12* (2006.01)
*H01L 33/00* (2010.01)

(52) U.S. Cl. ............ 257/79; 257/82; 257/E33.001

(58) Field of Classification Search ............ 257/12, 257/13, 37, 40, 79, 82, 85, 86, 90, E31.127, 257/E33.001, E39.007
See application file for complete search history.

(56) References Cited

U.S. PATENT DOCUMENTS

2005/0179034 A1 *  8/2005  Chikyow et al. ............ 257/43
* cited by examiner

*Primary Examiner* — Hoai V Pham
(74) *Attorney, Agent, or Firm* — Michaud-Kinney Group LLP

(57) ABSTRACT

A semiconductor structure includes a substrate which may be formed from a ZnS single crystal of wurtzite (2H) structure with a predetermined crystal orientation, and which has a first surface and a second surface. The structure includes a layer of a group III-nitride crystalline material deposited as an epitaxial layer on the first surface of the substrate. In one embodiment, the group III-nitride deposit is epitaxially grown using a MOCVD (or MOVPE) technique or a HVPE technique or a combination thereof. There may be a mask and/or a buffer layer on the first surface and/or a protective layer on the second surface.

16 Claims, 2 Drawing Sheets

US 8,143,630 B2

ZINC SULFIDE SUBSTRATES FOR GROUP III-NITRIDE EPITAXY AND GROUP III-NITRIDE DEVICES

CROSS REFERENCE TO RELATED APPLICATION

This application claims the benefit of U.S. provisional application No. 61/195,446 filed Oct. 7, 2008, which is incorporated herein by reference in its entirety.

BACKGROUND OF THE INVENTION

Group III-nitride semiconductors (e.g. GaN, AlN, InN, InGaN, AlGaN, and InAlGaN) are important for the fabrication of a variety of semiconductor devices, such as UV, blue and green light emitting diodes (LEDs) and laser diodes (LDs), high frequency devices (e.g. high electron mobility transistors, also known as HEMTs), high power switching devices, UV detectors, etc. Group III-nitride-based LEDs hold promise for general illumination applications because of their energy savings potential, long lifetime, compactness, and high efficiency. Despite the advances made in recent years in efficacies of commercial group III-nitride-based blue, green and white LEDs, LED lighting products still fall short of key performance and price requirements needed to meet the demands of the general lighting market. Group III-nitride-based LEDs emitting blue, green and UV light are usually produced with group III-nitride thin films grown on a substrate. To date, native group III-nitride substrates (GaN and AlN) are either not commercially available in large sizes and/or too costly to be considered as a viable choice of substrates for commercial volume production of LEDs. Commercial group III-V nitride-based HB-LEDs (high brightness—LEDs) are currently fabricated from thin films grown heteroepitaxially on sapphire substrates (which at present account for the majority of group III-nitride LEDs produced in the world) and SiC substrates using a MOCVD (metalorganic chemical vapor deposition) technique (also known as MOVPE technique). Other commercially available substrates, such as Si, GaAs, ZnO, other oxides (e.g. $LiAlO_3$) and even metals were studied for group III-nitride epitaxy and LEDs with little success.

Despite a low cost and a wide commercial availability, the incumbent sapphire substrates (as well as SiC substrates) have several drawbacks that limit the ability of commercial group III-nitride LED manufacturers to achieve a lower cost and a better LED performance. Theses drawbacks include: a large mismatch of thermal expansion to GaN; a high mechanical hardness or strength; and a high chemical inertness.

Sapphire is known to have a coefficient of thermal expansion (CTE) much larger than that of GaN and other group III-nitride alloys (InGaN and AlGaN). Therefore, a sapphire substrate with group III-nitride LED layers grown on it at a high temperature (e.g., about 1050° C.) will have a significant bow when cooled to room temperature due to thermal expansion mismatch. The bow complicates the subsequent LED device fabrication and test processes. In fact, as the substrate size gets larger (e.g. 10 centimeter (cm) (4-inch) or larger), the bow due to CTE mismatch between sapphire and GaN gets larger. The bow is an issue resulting in difficulties of implementing large diameter substrates in commercial LED production. Without being able to scale up the LED manufacture process to adopt progressively larger substrates (10 centimeter (cm) (4-inch), 15 cm (6-inch), 20 cm (8-inch), etc.), the cost of group III-nitride LEDs will remain too high for general illumination applications.

Since sapphire also has a high hardness (twice as that of GaN), coupled with a large CTE mismatch with GaN, a significant stress develops at the interface between the GaN epilayer and the substrate during the cool-down process after a MOVPE growth, and such a stress can lead to additional lattice defects and even cracks, resulting in a low LED performance and a low LED yield. In addition, because of the high hardness, the fabrication of sapphire substrates from sapphire crystal boules (i.e. coring/cropping, slicing, polishing and chemical-mechanical polishing (CMP)) is a relatively high cost operation compared to that of Si and GaAs substrates.

The high chemical inertness, or stability, of sapphire substrates is beneficial because sapphire can withstand the chemical etching during group III-nitride epitaxy. However, the high inertness of sapphire, coupled with a high mechanical hardness, does inhibit an easy removal of the substrates from the III-nitride layer during fabrication of LED dies. Complete removal of substrates to create "thin-film" LEDs is highly desirable because a "thin-film" LED has better light extraction (leading to a better efficacy), better heat dissipation (leading to a longer lifetime as well as a better efficacy), and a simpler LED device structure (leading to a lower cost for device processing). The laser lift-off technique for removing sapphire substrates from a group III-nitride device appears to be too costly for commercial volume production of LEDs. Therefore, an alternative substrate material that can address the above issues associated with the incumbent sapphire substrates and SiC substrates is needed for the commercial success of group III-nitride-based LEDs for solid state lighting applications. Such a substrate material will also benefit development and commercialization of other group III-nitride-based semiconductor devices.

The above-mentioned drawbacks of sapphire and SiC substrates also hinder the realization of low-cost, large-diameter (>5 centimeters) (>2 inches), crack-free, and freestanding GaN thick substrates (20 to 1000 micrometers (μm) in thickness) or bulk crystal boules (with a thickness larger than 1 mm) that can be grown via a hydride vapor phase epitaxy (HVPE) technique. The availability of low-cost freestanding GaN substrates or bulk substrates in high volume is beneficial to the development and commercialization of the above-described group III-nitride-based semiconductor devices.

SUMMARY OF THE INVENTION

The present invention resides in one aspect in a semiconductor structure having a substrate comprising a ZnS single crystal of wurtzite (2H) structure with a predetermined crystal orientation, a first surface and a second surface. The structure includes a group III-nitride crystalline material deposited as an epitaxial layer on the first surface of the substrate.

In one embodiment, the invention relates to a light-emitting diode which includes a substrate comprising a ZnS single crystal of wurtzite (2H) structure having a predetermined crystal orientation, a first surface and a second surface; and a layer of a group III-nitride crystalline material deposited as an epitaxial layer on the first surface of the substrate.

In another aspect, the invention relates to a method for making a semiconductor structure. The method includes providing a substrate comprising a ZnS single crystal of wurtzite (2H) structure having a predetermined crystal orientation, a first surface and a second surface, and depositing a layer of a group III-nitride crystalline material as an epitaxial layer on the first surface of the substrate.

In various embodiments described herein, a ZnS single crystal of wurtzite (2H) structure with a predetermined crystal orientation that is used as a substrate on which a single crystal group III-nitride deposit is epitaxially grown using a MOCVD (or MOVPE) technique or a HVPE (hydride vapor phase epitaxy) technique or a combination of the two techniques and the two surfaces of the substrate are prepared in a way selected from the following list: (A) One surface on which group III-nitride growth will take place is polished to less than 5 nanometers (nm) surface roughness and the other surface is either ground or polished; (B) One surface on which group III-nitride growth will take place is polished to less than 5 nm surface roughness and the other surface, either ground or polished, coated with a protective coating; (C) One surface of the substrate on which group III-nitride growth will take place is polished to less than 5 nm surface roughness and then coated with a patterned masking layer to facilitate an epitaxial lateral over-growth (ELO) of group III-nitrides, and the other surface, either ground or polished, is a bare surface; (D) One surface of the substrate on which group III-nitride growth will take place is polished, deposited with a thin layer of GaN, and then coated with a patterned masking layer to facilitate an ELO growth of group III-nitrides, and the other surface, either ground or polished, is a bare surface; (E) One surface of the substrate on which group III-nitride growth will take place is polished to less than 5 nm surface roughness and then coated with a patterned masking layer to facilitate an ELO growth of group III-nitride, and the other surface, either ground or polished, coated with a protective coating. (F) One surface of the substrate on which group III-nitride growth will take place is polished, deposited with a thin layer of GaN, and then coated with a patterned masking layer to facilitate an ELO growth of group III-nitride, and the other surface, either ground or polished, coated with a protective coating.

BRIEF DESCRIPTION OF THE DRAWINGS

Like reference numbers and designations in the various drawings indicate like elements.

DETAILED DESCRIPTION

Figure 1:
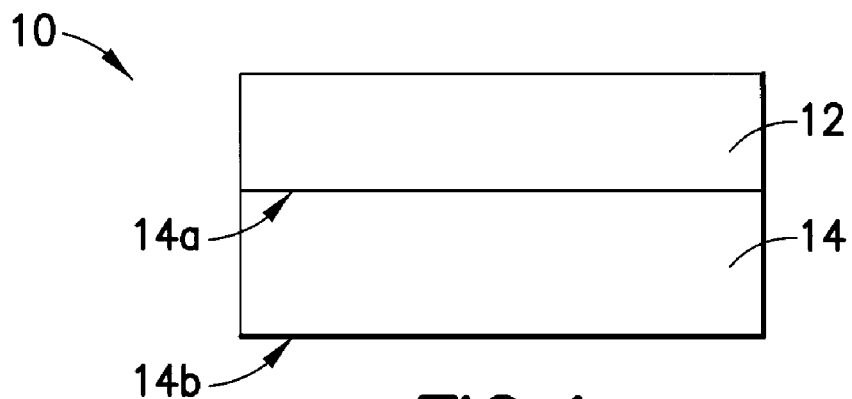
FIG. 1 is a schematic cross-section of a semiconductor structure according to a first illustrative embodiment.

In an illustrative embodiment, a semiconductor structure indicated at 10 in FIG. 1 comprises a group III-nitride crystalline material deposited as an epitaxial layer 12 (also known as an "epilayer") on a substrate 14. The substrate 14 comprises zinc sulfide (ZnS) and has a first surface 14a on which the layer of a group III-nitride crystalline material is disposed, and a second surface 14b. In one specific embodiment, the first surface 14a may be polished to a surface roughness ($R_{RMS}$) of 5 nanometers or less. The second surface 14b may be ground or polished. The group III-nitride crystalline material of the epitaxial layer 12 is useful as a semiconductor material from which various devices may be made. In various embodiments described further below, the group III-nitride crystalline material of the epitaxial layer 12 may be in the form of one or more thin films having a total thickness of about 0.1 μm to about 10 μm; a thick film having a thickness of more than about 10 μm to about 1000 μm; a bulk crystal having a thickness of more than about 1 mm, or any other useful form.

In various embodiments, the substrate 14 may comprise ZnS single crystal boules up to 51 mm in diameter, and/or ZnS substrates of 2.54 cm (1-inch) in diameter and 5.1 cm (2-inch) in diameter produced using a growth technique disclosed in U.S. Pat. No. 7,279,040 which is incorporated herein by reference in its entirety. In some embodiments ZnS single crystal wafers with dislocation densities ranging from essentially dislocation-free to less than 100 per square centimeter are attained. Such dislocation densities achieved in ZnS single crystal substrates 14 are significantly lower than that in commercial compound semiconductor substrates such as GaAs, InP, GaP, and SiC, which are currently available on the world semiconductor wafer market. In various embodiments, the ZnS single crystal may have one or more of a (0001) crystal orientation with a deviation angle of less than about 3 degrees; or a (1-100) m-plane crystal orientation with a deviation angle of less than about 3 degrees; or a (1-100) a-plane crystal orientation with a deviation angle of less than about 3 degrees, or another crystal orientation.

The Applicants have realized that ZnS single crystals of wurtzite structure (2H) are suitable for use as substrates 14 in production of group III-nitride-based devices, replacing sapphire substrates. This point may be seen more clearly through comparing the relevant properties of ZnS (wurtzite structure) with other commonly-known substrate materials. Table 1 is a compilation of selected properties of GaN, AlN, InN, ZnS, sapphire and other substrate materials.

TABLE 1

Selected Properties of Substrate Materials for group III-Nitride Epitaxy

| Material | Melting Point (K) | Crystal Structure | Lattice Constant (Å) | Knoop Hardness (GPa) | Coefficient of Thermal expansion ($10^{-6}$ $K^{-1}$ (300 K)) |
|---|---|---|---|---|---|
| GaN | >2000 | Hexagonal (2H) | a = 3.190<br>c = 5.189 | 10.2 | 5.6 (//a-axis)<br>4.5 (//c-axis) |
| AlN | >2400 | Hexagonal (2H) | a = 3.112<br>c = 4.982 | 12 | 4.2 (//a-axis)<br>5.3 (//c-axis) |
| InN | — | Hexagonal (2H) | a = 3.548<br>c = 5.760 | 10 | — |
| ZnS | 2103 | Hexagonal (2H) | a = 3.814<br>c = 6.258 | 1.8 | 6.5 (//a-axis)<br>4.6 (//c-axis) |
| ZnO | 2248 | Hexagonal (2H) | a = 3.250<br>c = 5.205 | 4.5 | 5.6 (//a-axis)<br>3.4 (//c-axis) |
| Sapphire | 2327 | Hexagonal-(Rhombohedral) | a = 4.758<br>c = 12.99 | 20 | 7.5 (//a-axis)<br>8.5 (//c-axis) |
| SiC | >2500 | Hexagonal (6H) | a = 3.076<br>c = 15.12 | 21.3 | 4.2 (//a-axis)<br>4.6 (//c-axis) |
| GaAs | 1513 | Cubic | a = 5.653 | 7.5 | 5.4 |
| Si | 1687 | Cubic | a = 5.430 | 9.2 | 2.6 |

It can be seen from the data in Table 1 that ZnS has a high melting point, indicating its good thermal stability at high temperatures. ZnS has a low vapor pressure at low temperatures (e.g., at about 550° C.) at which MOVPE low-temperature nucleation layers of AlN or GaN are usually deposited. However, ZnS does have an appreciable vapor pressure at MOVPE growth temperatures (e.g., at about 1050° C.) and in certain optional embodiments, this issue can be addressed as discussed elsewhere herein. Although the lattice constants of ZnS are larger than GaN lattice parameters, the lattice mismatch between a GaN epilayer and a ZnS substrate 14 is about 16%, which is not out of the range of mismatch of other known substrate materials, e.g., the lattice mismatches between GaN and sapphire, Si and GaAs substrates are about 14%, 16% and 20%, respectively.

The thermal expansion coefficient of ZnS is slightly larger than that of GaN, and the Knoop hardness of ZnS (1.8 GPa) is less than ⅕ of that of GaN (10.2 GPa). A low mismatch between ZnS and GaN produces LED wafers with a reduced bow and hence allows a scale-up of the LED production to use substrates 14 of progressively larger diameters (10 cm (4-inch), 15 cm (6-inch), 20 cm (8-inch), etc.). The combination of a low CTE mismatch and a low ZnS hardness inhibits the formation of defects or cracks generated in group III-nitride crystalline materials of an epitaxial layer 12 grown on a ZnS substrate 14 when the substrate and epilayer thereon are cooled down from the epitaxial growth temperature to room temperature.

Figure 2:
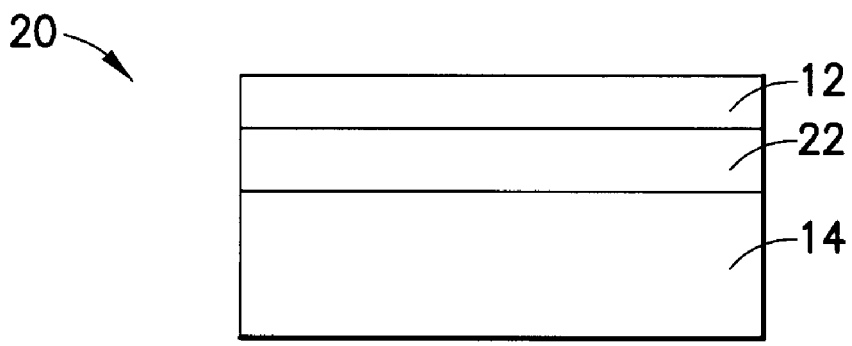
FIG. 2 is a schematic cross-section of a semiconductor structure according to a second illustrative embodiment.

In another embodiment, a semiconductor structure indicated at 20 in FIG. 2 includes an epitaxial layer 12 of group III-nitride crystalline material deposited on a substrate 14, with a buffer layer 22 between the epitaxial layer and the substrate. The buffer layer 22 can serve to mitigate the lattice mismatch between the substrate 14 and the epitaxial layer 12. In one embodiment, the buffer layer 22 comprises InGaN with a high indium content (e.g. 80% indium), which can help to achieve a better epitaxy growth. In other embodiments, the buffer layer 22 may comprise ZnO or ZnOS, both of which are native to a substrate 14 comprising ZnS crystal and may be formed readily on a ZnS substrate to facilitate the growth of high quality epitaxial crystals on the substrate. In other embodiments, a buffer layer 22 may comprise AlN and/or GaN.

As pointed out earlier, there is a potential issue associated with using substrates 14 comprising ZnS in a GaN MOVPE growth system or a HVPE growth system, that is, the reactivity of ZnS with MOVPE or HVPE gases, such as $H_2$, $NH_3$, HCl, and TMGa (trimethylgallium). Due to the relatively high vapor pressure of ZnS at GaN epitaxial growth temperatures (e.g., about 1050° C.), the reaction of ZnS with epitaxial growth gases can be pronounced. Table 2 shows calculated values of the total equilibrium pressure of Zn and $S_2$ vapors above a ZnS at various temperatures.

TABLE 2

Equilibrium Vapor Pressures above ZnS at Elevated Temperatures.

| Temperature (° C.) | Total Vapor Pressure (Zn & $S_2$) above ZnS (torr) |
|---|---|
| 600 | 0.0000108 |
| 700 | 0.000323 |
| 800 | 0.00525 |
| 900 | 0.0521 |
| 1000 | 0.365 |
| 1050 | 0.872 |
| 1100 | 1.97 |

It can be seen from the data of Table 2 that at temperatures at which a low-temperature nitride buffer layer 22 is usually grown (e.g. at about 600° C.), the vapor pressure of ZnS is negligible, and hence growth of a low-temperature AlN and/or GaN buffer layer 22 can be achieved without significant interference from Zn and $S_2$ vapor. However, at the regular GaN epitaxial growth temperatures (e.g., at about 1050° C.), the vapor pressure above ZnS is appreciable, about 0.872 mmHg (0.872 torr). Since Zn and $S_2$ vapors can react with chemical gases and potentially introduce contamination/doping (Zn in particular) in GaN thin films, some measures to prevent significant evaporation may be required.

Figure 3:
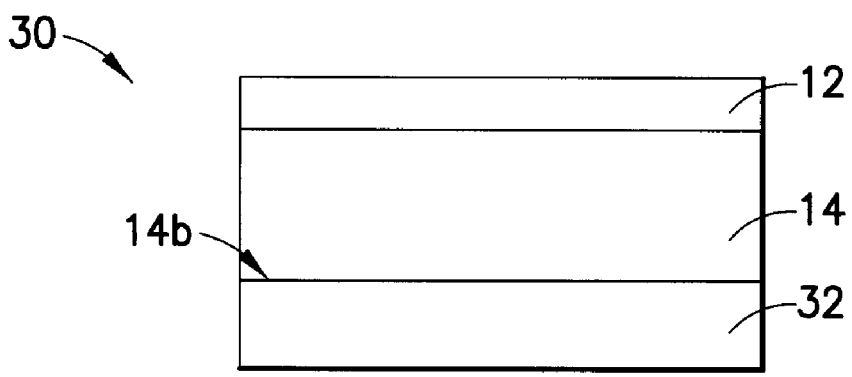
FIG. 3 is a schematic cross-section of a semiconductor structure according to a third illustrative embodiment.

One way to address the evaporation issue is to coat the second surface of a ZnS substrate with a protective layer made of a group III-nitride (such as GaN, AlN, AlGaN, InGaN, or a combination thereof), ZnO, or $ZnO_xS_{1-x}$ (where 0<x<1), or a combination thereof. For example, an illustrative semiconductor structure indicated at 30 in FIG. 3 includes an epitaxial layer 12 of group III-nitride crystalline material deposited on a substrate 14 which is coated with a protective coating 32 on the second surface 14b of the substrate. The protective coating 32 may comprise one or more materials such as glassy carbon, $SiO_2$, $Si_3N_4$, or the like. The protective coating 32 serves to ameliorate the evaporation of Zn and S from the substrate 14 during deposition of the epitaxial layer 12 thereon. In one embodiment, a protective coating 32 comprises a glassy carbon coating derived from a layer of photoresist material which may be deposited on the substrate 14 by the following method: The photoresist material is spin-coated onto the second surface 14b of a ZnS substrate 14, which is then pre-baked at about 100° C. to harden and is then annealed in a vacuum furnace at a temperature up to 1000° C. to form a thin glassy-carbon layer protective coating 32 having a thickness of about 1 to about 5 micrometers on the substrate 14. However, the invention is not limited in this regard, and in other embodiments, any other suitable technique may be employed to provide the layer of photoresist material from which the protective coating 32 is derived, and any other suitable thickness of the protective coating may be employed. In another embodiment, a coating, e.g., protective coating 32 made from $SiO_2$, $Si_3N_4$, or the like, may be provided via a sputtering deposition process.

Figure 4A:
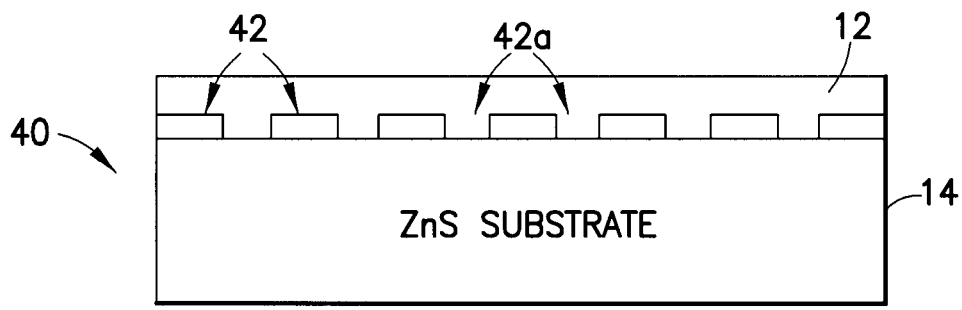
FIG. 4A is a schematic cross-section of a semiconductor structure according to a fourth illustrative embodiment.
Figure 4B:
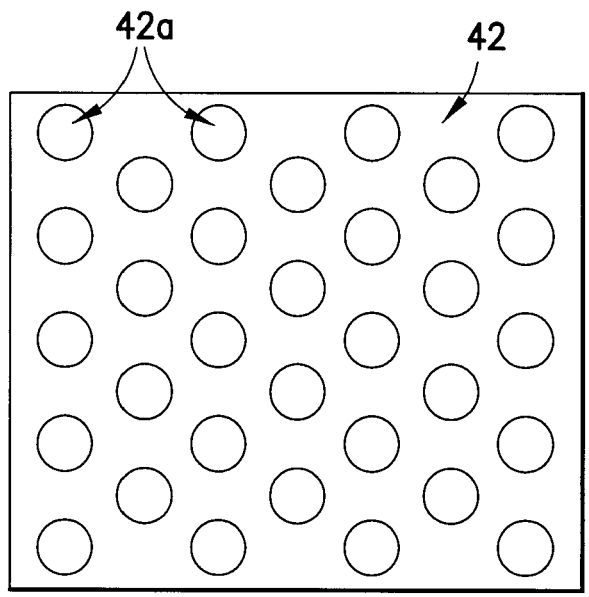
FIG. 4B is a plan view of the structure of FIG. 4A.

In yet another embodiment, a semiconductor structure indicated at 40 in FIG. 4 includes a substrate 14 which comprises ZnS and which has a top face 14a on which a mask 42 is applied. The mask 42 is formed from a material that is suitable to provide a protective coating and which may comprise one or more materials such as glassy carbon, $SiO_2$, and/or $Si_3N_4$ or the like, with periodic openings (windows) 42a. The mask 42 allows an epitaxial lateral over-growth ($E_LO$) or selected area growth (SAG) of high-quality group III-nitride thin films and devices via a MOCVD technique or a HVPE technique. A masked ZnS substrate 14 also allows growth of group III-nitride thick films so that a freestanding GaN wafer can be achieved. In one embodiment, a mask 42 of a glassy carbon type may be fabricated on the substrate 14 using the following process steps: first, a layer of photoresist material is spin-coated onto the back surface 14b of the ZnS substrate 14, the spin-coated substrate is pre-baked at about 100° C. to harden; then the photoresist material is exposed to UV light in a lithography machine to create a predetermined pattern. The photoresist material is then developed to create the pattern of periodic openings 42a, as schematically shown in FIG. 4, and the photoresist material is annealed in a vacuum furnace at a temperature up to 1000° C. to form a glassy-carbon mask 42 on the substrate. The thickness of the mask 42 produced in this way will be about 50 to about 200 nanometer (nm). However, the invention is not limited in this regard, and in other embodiments, any other suitable process may be used to form a layer of photoresist material from which the mask 42 is derived, and the mask may be made to other thicknesses. In still other embodiments, a mask 42 made from $SiO_2$, $Si_3N_4$, or the like may be formed on the substrate 14 via a sputtering deposition process followed by any known process commonly used for creating openings in the resulting mask layer. As indicated above, the epitaxial layer 12 of group III-nitride crystalline material may be deposited over the mask 42 in a variety of forms, e.g., thin film, thick film, etc.

Figure 5:
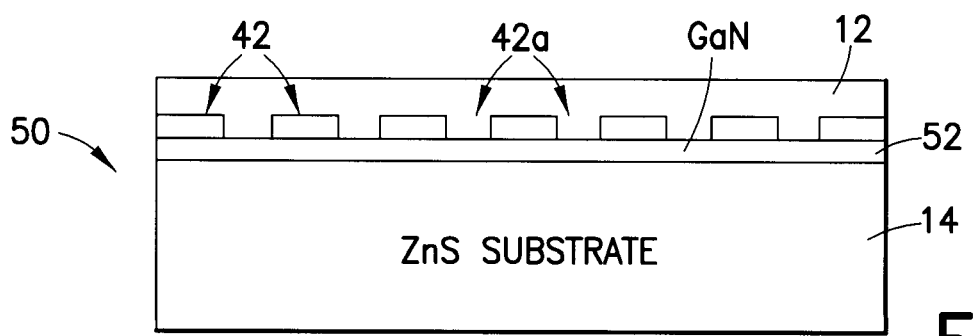
FIG. 5 is a schematic cross-section of a semiconductor structure according to a fifth illustrative embodiment.

In another embodiment, a semiconductor structure indicated at 50 in FIG. 5 includes a substrate 14 on which a buffer layer 52 is applied before the mask 42 is formed thereon, so that the mask is formed on the buffer layer. The mask 42 may be made of glassy carbon, or $SiO_2$, or $Si_3N_4$ or the like. The buffer layer 52 may comprise, e.g., GaN, AlN, and/or ZnO.

A ZnS substrate 14 can be removed from the epitaxial layer 12 formed thereon in various ways to form free-standing group III-nitride semiconductor devices. For example, the ZnS substrate 14 can be removed from a thin film epitaxial layer 12 via chemical etching in an acid such as concentrated nitric acid, or Aqua Regia, or by mechanical grinding and polishing, or by a combination of these techniques, to form "thin-film" devices such as LEDs at a low cost and a high yield. A thin-film LED has a much better light extraction (leading to a better efficacy), a better heat dissipation (leading to a longer lifetime as well as a better efficacy), and a simpler LED device structure (leading to a lower cost in device processing) than other LEDs. In addition, because both ZnS and GaN have the same wurtzite (2H) structure, non-polar GaN epitaxial layers can be grown on non-polar ZnS substrates, which may eliminate the so-called "drooping" issue in group III-nitride LEDs wherein efficacy decreases as driving current density increases.

Because of the above-mentioned properties of ZnS crystals, the substrate 14 can be used for producing an epitaxial layer 12 in the form of freestanding GaN thick films (e.g. about 10 to about 1,000 micrometers (μm) in thickness) and even bulk crystal boules, (with a thickness larger than 1 millimeter (mm)) using a hydride vapor phase epitaxy (HVPE) technique. In various embodiments, a ZnS substrate 14 can be removed from a thick film epitaxial layer 12 via chemical etching in an acid such as concentrated nitric acid, or Aqua Regia, or by mechanical grinding and polishing, and thermal decomposition (e.g., at a temperature of more than about 1200° C.), or by a combination of these techniques, to provide a freestanding thick film.

In various embodiments, a freestanding epitaxial layer 12 may be further fabricated into substrates that may be used in group III-nitride epitaxy and device fabrication. In certain embodiments, bulk crystal group III-nitride crystalline material of the epitaxial layer 12 can be made into wafers and substrates that may be used in III-nitride epitaxy and device fabrication.

An epitaxial layer 12 of group III-nitride crystalline material in the form of a thin film or a stack thin films can be deposited on the ZnS substrate 14 as described herein and used to fabricate semiconductor devices such as light emitting diodes (LEDs) emitting in the blue, green, UV and deep UV spectra; laser diodes (LDs) emitting in the blue, green, UV and deep UV spectra; high frequency devices, such as high electron mobility transistors (HEMTs); high power electronic devices that are used to handle high electrical voltage or high electrical current or both, such as, MESFET, PIN diodes; surface acoustic wave (SAW) devices; UV detectors, including solar-blind or visible-blind UV detectors; spintronics devices (devices that operate on the basis of changes in spin properties); high temperature devices; integrated circuits (ICs), and others.

The terms "first," "second," and the like, herein do not denote any order, quantity, or importance, but rather are used to distinguish one element from another. The terms "a" and "an" herein do not denote a limitation of quantity, but rather denote the presence of at least one of the referenced item.

Although the invention has been described with reference to particular embodiments thereof, it will be understood by one of ordinary skill in the art, upon a reading and understanding of the foregoing disclosure, that numerous variations and alterations to the disclosed embodiments will fall within the scope of this invention and of the appended claims.

What is claimed is:

1. A semiconductor structure comprising:
 a substrate comprising a ZnS single crystal of wurtzite (2H) structure having a predetermined crystal orientation and a first surface; and
 a group III-nitride crystalline material deposited as an epitaxial layer on the first surface of the substrate, wherein there is a mask layer disposed on the first surface between the substrate and the group III-nitride crystalline material, the mask layer having a plurality of openings therein.

2. The structure of claim 1, wherein the substrate has a second surface, and wherein the structure includes a protective coating on the second surface.

3. The structure of claim 1, wherein the substrate has a second surface, and wherein the structure includes a protective layer on the second surface.

4. The structure of claim 1, wherein there is a buffer layer disposed on the first surface between the substrate and the mask layer.

5. The structure of claim 4, wherein the buffer layer is a crystalline material selected from a list of the following materials: GaN, AlN, ZnO, GaAlN, GaInN, or a combination thereof.

6. The structure of claim 4 wherein the substrate has a second surface, and wherein the structure includes a protective layer on the second surface.

7. The structure of claim 1, wherein the ZnS single crystal has a (0001) crystal orientation with a deviation angle of less than about 3 degrees.

8. The structure of claim 1, wherein the ZnS single crystal has a (1-100) m-plane crystal orientation with a deviation angle of less than about 3 degrees.

9. The structure of claim 1, wherein the ZnS single crystal has a (1-100) a-plane crystal orientation with a deviation angle of less than about 3 degrees.

10. The structure of claim 1, wherein the group III-nitride crystalline material is configured as one or more thin films having a total thickness of about 0.1 μm to about 10 μm.

11. The structure of claim 1, wherein the group III-nitride crystalline material is configured as a thick film having a thickness of more than about 10 μm to about 1000 μm.

12. The structure of claim 1, wherein the group III-nitride crystalline material is configured as a bulk crystal having a thickness of more than about 1 mm.

13. The structure of claim 1, wherein the group III-nitride crystalline material comprises GaN, AlN, InN, $In_xGa_{1-x}N$ (where $0<x<1$), $Al_xGa_{1-x}N$ (where $0<x<1$), $Al_xIn_{1-x}N$ (where $0<x<1$), or $Al_xIn_yGa_{2-x-y}N_2$ (where $0<x<1$ and $0<y<1$), or a combination thereof.

14. The structure of claim 1, wherein the substrate has a second surface, and wherein the structure includes a protective coating on the second surface, the protective coating includes glassy carbon, $SiO_2$, $Si_3N_4$, a group III-nitride (GaN, AlN, AlGaN, InGaN), ZnO, or $ZnO_xS_{1-x}$ (where $0<x<1$), or a combination thereof.

15. The structure of claim 1 wherein said mask layer comprises glassy carbon, $SiO_2$, or $Si_3N_4$, or a combination thereof.

16. A light-emitting diode comprising:
a substrate comprising a ZnS single crystal of wurtzite (2H) structure having a predetermined crystal orientation and a first surface; and
a layer of a group III-nitride crystalline material deposited as an epitaxial layer on the first surface of the substrate, wherein there is a mask layer disposed on the first surface between the substrate and the group III-nitride crystalline material, the mask layer having a plurality of openings therein.

* * * * *